United States Patent
Tsorng et al.

(10) Patent No.: US 10,622,026 B1
(45) Date of Patent: Apr. 14, 2020

(54) UNIVERSAL STORAGE CARRIER

(71) Applicant: QUANTA COMPUTER INC., Taoyuan (TW)

(72) Inventors: Yaw-Tzorng Tsorng, Taoyuan (TW); Shin-Ming Su, Taoyuan (TW); Chun Chang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/411,925

(22) Filed: May 14, 2019

Related U.S. Application Data

(60) Provisional application No. 62/758,115, filed on Nov. 9, 2018.

(51) Int. Cl.
*H05K 5/00* (2006.01)
*G11B 33/12* (2006.01)
*H05K 5/02* (2006.01)

(52) U.S. Cl.
CPC ......... *G11B 33/124* (2013.01); *H05K 5/0204* (2013.01); *H05K 5/0221* (2013.01); *H05K 5/0282* (2013.01)

(58) Field of Classification Search
CPC ....................................................... H05K 5/00
See application file for complete search history.

(56) References Cited

U.S. PATENT DOCUMENTS

| | | | |
|---|---|---|---|
| 2005/0057895 A1* | 3/2005 | Chen | G06F 1/184 361/679.33 |
| 2013/0015309 A1 | 1/2013 | Fan | |
| 2016/0209891 A1 | 7/2016 | Peng et al. | |
| 2016/0217097 A1* | 7/2016 | Gomez | G06F 13/4068 |
| 2016/0259597 A1* | 9/2016 | Worley | G06F 3/0688 |
| 2017/0147042 A1 | 5/2017 | Liu et al. | |

OTHER PUBLICATIONS

Extended European Search Report for EP Application No. 19189708.1, dated Mar. 2, 2020.

* cited by examiner

*Primary Examiner* — Jerry Wu

(74) *Attorney, Agent, or Firm* — Nixon Peabody LLP; Zhou Lu

(57) ABSTRACT

An adapter bracket configured to be mounted within a carrier device is provided. The adapter bracket includes a receiving space configured to receive a storage module, a first wall element located on one side of the receiving space, and a second wall element located opposite of the first wall element. The adapter bracket also includes receiving elements located between the first wall element and the second wall element. The receiving elements are configured to receive a securing element through an aperture on the storage module.

20 Claims, 10 Drawing Sheets

UNIVERSAL STORAGE CARRIER

CROSS REFERENCE TO RELATED APPLICATIONS

This application claims priority under 35 U.S.C. § 119 to U.S. Provisional Application No. 62/758,115, entitled "UNIVERSAL STORAGE CARRIER" and filed on Nov. 9, 2018. The contents of that application are hereby incorporated by reference in their entirety.

FIELD OF THE INVENTION

The present invention generally relates to storage device carriers and chassis assemblies. More particularly, the present invention relates to storage device carriers configured to house more than one type of storage device.

BACKGROUND

Traditional computer systems and information networks typically require external data storage for storing large volumes of data. The external data storage typically includes Hard Disk Drives (HDDs) or Solid State Disk (SSD) drives. The HDD/SSD family sizes known in the related art include at least 3.5", 2.5", 1.8", 1.3" and 1.0" diameter drives.

Various mechanisms have been developed for housing the HDDs or SSD drives. One such mechanism is referred to as a hard disk drive (HDD) carrier and chassis assembly. FIG. 1A illustrates a traditional 2.5" HDD carrier and chassis assembly 10. FIG. 1B illustrates a traditional 3.5" HDD carrier and chassis assembly 20. The HDD carrier and chassis assembly 10 accommodates a 2.5" HDD 12 and mechanically mates with a chassis assembly (not shown). Similarly, the HDD carrier and chassis assembly 20 accommodates a 3.5" HDD 25 and mechanically mates with the chassis assembly.

During operation, an HDD is typically disposed in the HDD carrier. The HDD carrier is then inserted into a drive cage (or drive bay) in a computer chassis. The outer walls of the HDD carrier can include electromagnetic interface (EMI) shield. The EMI shield functions to prevent any EMI interference from radiating outside of the computer or disk enclosure. The EMI shield also functions to reduce the susceptibility of the HDD/SDD to EMI interference originating from other components external to the EMI shield.

Often, the computer chassis is installed into a standard rack of predetermined dimensions. The rack may have at least one linear dimension that is a multiple of a standard dimension. The standard dimension is referred to as a rack unit ("U" or "RU"), and multiples of this dimension are referred to as 2U, 3U, etc. Within each enclosure (shelf), there are a number of disk drives. Each disk drive may be located horizontally or vertically into the shelf. Each disk drive will be inserted into a 'Sled' or 'Disk Carrier.'

Despite the advantages of the HDD carrier and chassis assembly, it suffers from certain drawbacks. For example, storage density in a chassis may be unable to fully take advantage of new, physically smaller drive sizes because the number of drives in the chassis—and ultimately the storage capacity—is limited by the size of the sled holding the drive. The size and quantity of connectors needed to interface the drives to the chassis for electrical communication has an undesirable impact upon the volumes of space able to be devoted to other functions within the chassis. Furthermore, the lack of a hot-swap capability results in more cumbersome maintenance procedures when a drive has to be replaced. The present disclosure teaches a carrier and chassis assembly configured to house more than one type of storage device.

SUMMARY

Embodiments of the disclosure concern an adapter bracket configured to be mounted within a carrier device. The adapter bracket includes a receiving space for receiving a storage module (e.g., solid state drive (SSD)), a first wall element located on one side of the receiving space, and a second wall element located opposite of the first wall element. The adapter bracket also includes receiving elements located between the first wall element and the second wall element. The receiving elements are configured to receive at least one securing element through an aperture on the storage module.

In some embodiments, the receiving elements are located in various positions to correspond to known SSD Card sizes. The receiving elements can include a threaded hole configured to receive a screw. In some embodiments, the first wall element includes a first sliding structure, and the second wall element includes a second sliding structure. In this embodiment, the storage module can be inserted into the adapter bracket in a shear direction.

The SSD module can include more than one SSD card. The receiving elements located between the first wall element and the second wall element can include a different material than the adapter bracket. In some embodiments, the first wall element includes a hook element. The second wall element can also include a hook element. In this embodiment, the storage module can be inserted into the adapter bracket in a normal direction.

Embodiments of the disclosure also concern a carrier device configured to secure the adapter bracket discussed above. The carrier device can include a receiving area configured to receive the adapted bracket, which includes a storage module (e.g., solid state drive (SSD)). The carrier device also includes a first wall structure located at a first side of the receiving area and a second wall structure located opposite of the first wall structure. The carrier device also includes receiving components located between the first wall structure and the second wall structure. The receiving components are configured to receive a securing element through an aperture on the adapter bracket.

Additional features and advantages of the disclosure will be set forth in the description that follows, and in part, will be obvious from the description; or can be learned by practice of the principles disclosed herein. The features and advantages of the disclosure can be realized and obtained by means of the instruments and combinations particularly pointed out in the appended claims. These and other features of the disclosure will become fully apparent from the following description and appended claims, or can be learned by the practice of the principles set forth herein.

BRIEF DESCRIPTION OF THE DRAWINGS

In order to describe the manner in which the above-recited disclosure and its advantages and features can be obtained, a more particular description of the principles described above will be rendered by reference to specific examples illustrated in the appended drawings. These drawings depict only example aspects of the disclosure, and are therefore not to be considered as limiting of its scope. These principles are described and explained with additional specificity and detail through the use of the following drawings.

DETAILED DESCRIPTION

Figure 1A:
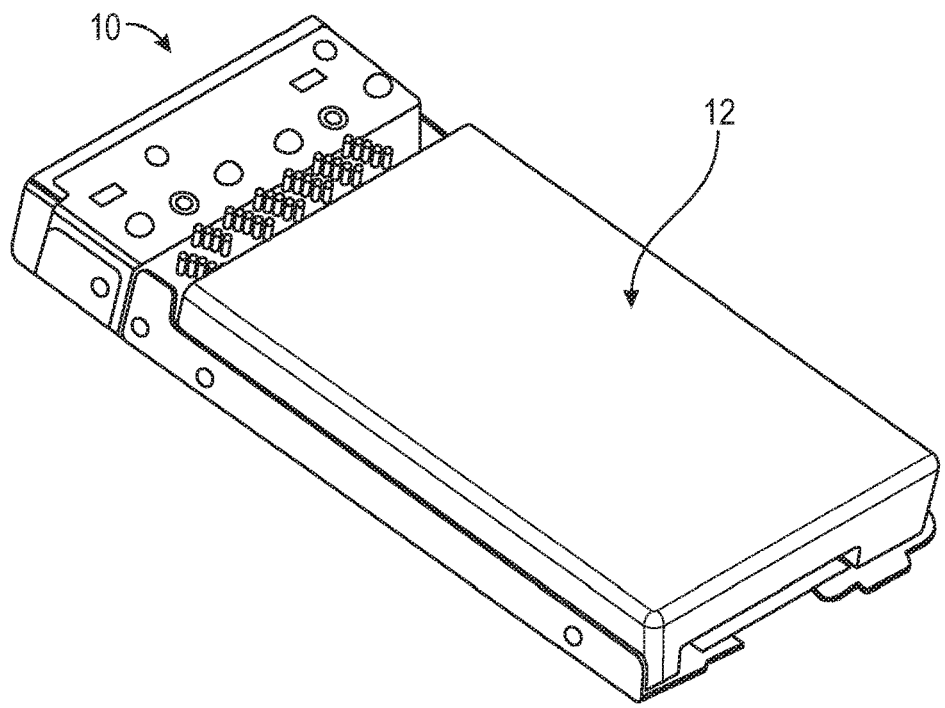
FIG. 1A illustrates a traditional 2.5" HDD carrier and chassis assembly, as known in the prior art.

The present invention is described with reference to the attached figures, where like reference numerals are used throughout the figures to designate similar or equivalent elements. The figures are not drawn to scale, and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 2:
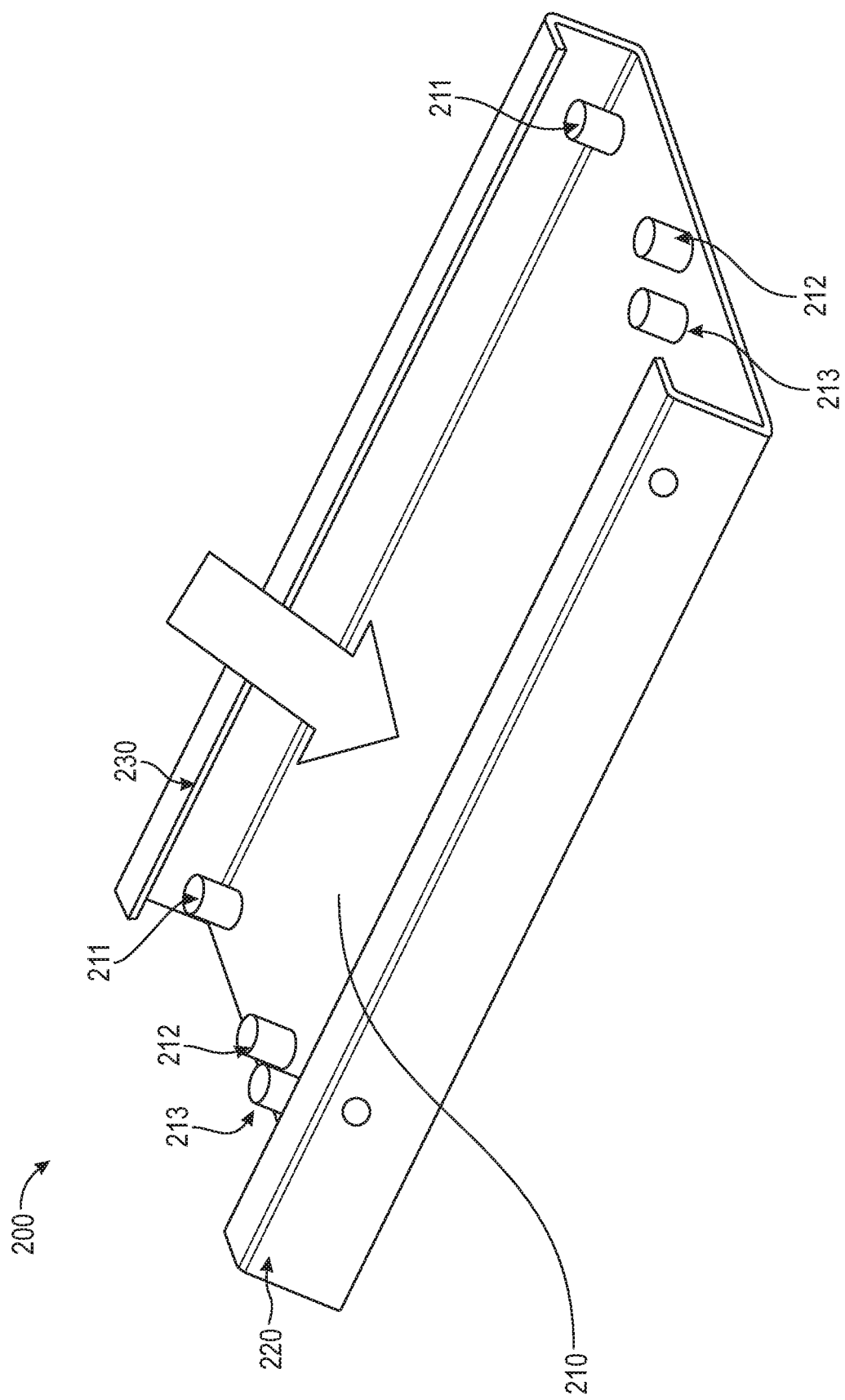
FIG. 2 illustrates an adapter bracket configured to house an SSD module, in accordance with an embodiment of the disclosure.

FIG. 2 illustrates an adapter bracket 200 configured to house an SSD drive (not shown), in accordance with an embodiment of the disclosure. The adapter bracket 200 and its components can be made of sheet metal using conventional metal fabrication techniques such as bending, forming, and stamping. In alternative embodiments, the adapter bracket 200 can be made from stainless steel, mild steel, or any material that is cost effective; and achieves high levels of hardness and corrosion resistance. The adapter bracket is configured to house any size SSD drive, including but not limited to, a M.2 SSD Card, a M.3 SSD Card, or an EDSFF (Enterprise & Datacenter Storage Form Factor) SSD Card. Once an SSD card is mounted within the adapter bracket 200, the adapter bracket 200 can be inserted into a carrier and chassis assembly. This is discussed in greater detail below with respect to FIGS. 6A and 6B.

The adapter bracket 200 can include a left wall element 220 and a right wall element 230. The adapter bracket 200 can also include a receiving space 210. The left wall element 220 and the right wall element 230 are located on opposing sides of the receiving space 210. The receiving space 210 can include receiving elements 211, 212, and 213 configured to secure the SSD card. For example, an SSD card can have apertures configured to receive a screw. The receiving elements can include threading so the screw can be secured, effectively mounting the SSD within the adapter bracket 200.

Figure 1B:
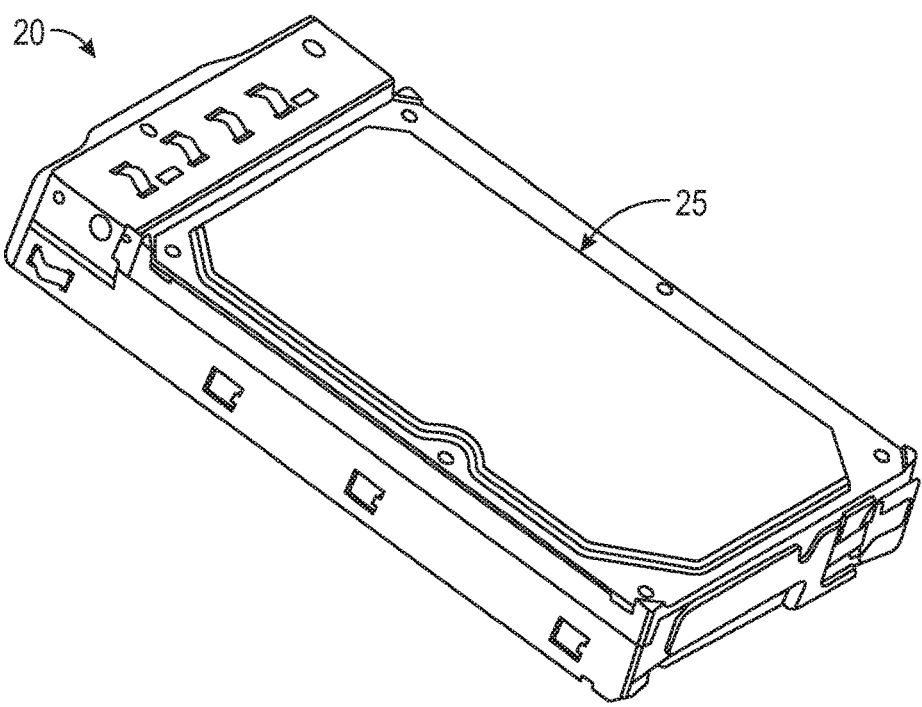
FIG. 1B illustrates a traditional 3.5" HDD carrier and chassis assembly, as known in the prior art.

The receiving elements 211 can vary in position to account for the various size SSD cards. For example, a M.2 SSD Card is smaller in length than the M.3 and EDSFF SSD Cards. The receiving elements can be closer to each other on opposing sides of the receiving space 210 to account for the smaller M.2 SSD Card. Thus, the adapter bracket 200 is configured to secure various sized SSD Cards. In alternative embodiments, the adapter bracket 200 can be configured for a specific size SSD card. The adapter bracket 200 can be inserted into a specific size carrier that coincides with the size adapter bracket 200. Exemplary size carriers are illustrated in FIGS. 1A and 1B.

Figure 3B:
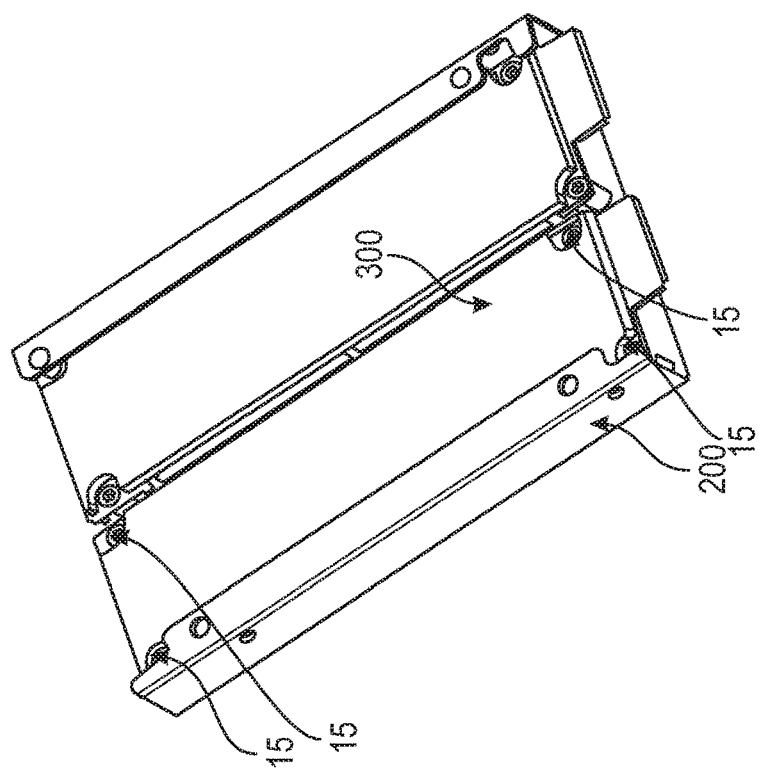
FIG. 3B illustrates the assembly of the SSD module within the adapter bracket, in accordance with an embodiment of the disclosure.
Figure 3A:
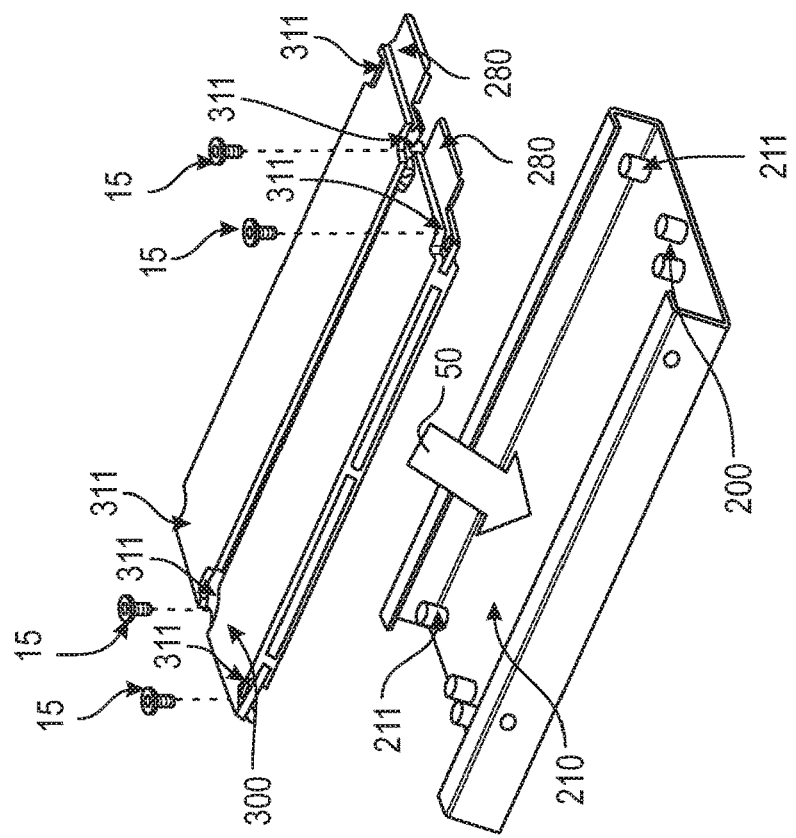
FIG. 3A illustrates an exploded view of the SSD module being installed into the adapter bracket, in accordance with an embodiment of the disclosure.

FIG. 3A illustrates an exploded view of an SSD module 300 being mounted onto the adapter bracket 200, in accordance with an embodiment of the disclosure. The SSD module 300, provided as an exemplary illustration, houses two EDSFF SSD Cards 280. The SSD module 300 can include multiple apertures 311. In the exemplary embodiment shown herein, the apertures 311 of the SSD module 300 coincide with the position of the receiving elements 211 of the adapter bracket 200. In some embodiments, securing elements 15 can be received through the apertures 311 and inserted into the threaded receiving elements 211. It should be understood by one of ordinary skill in the art that the securing elements can include any connectors or fasteners, such as nuts and bolts, screws, or the like. The SSD module 300 can be inserted into the adapter bracket 200 in a normal direction 50. Once inserted into the receiving space 210 of the adapter bracket 200, the SSD module 300 can be secured using the securing elements 15. FIG. 3B illustrates the assembly of the SSD module 300 within the adapter bracket 200. The adapter bracket 200 can be inserted into a carrier and chassis assembly (not shown herein). This is discussed in greater detail below with respect to FIGS. 6A and 6B.

Figure 4A:
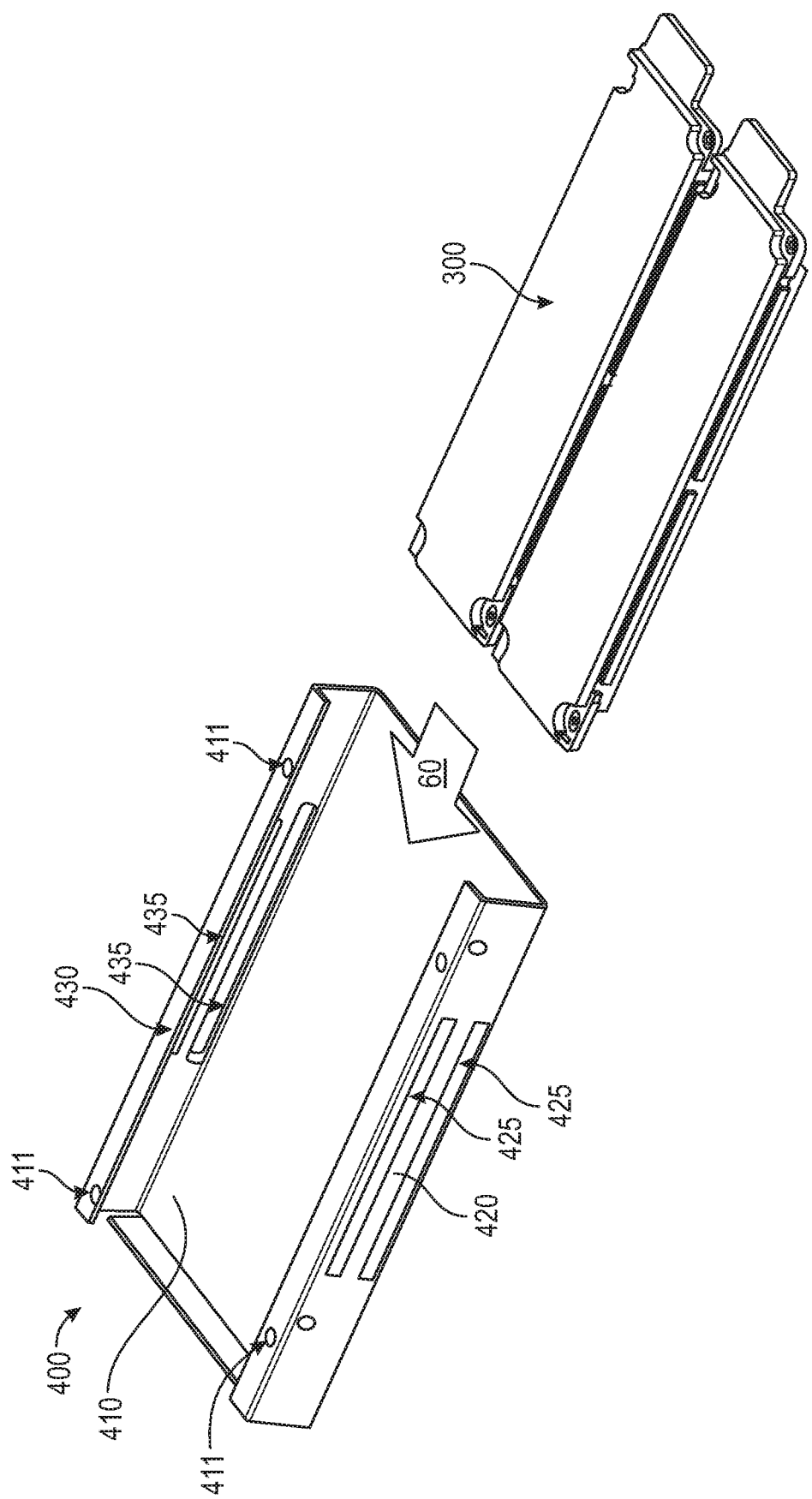
FIG. 4A illustrates an exploded view of the SSD module mounted within an alternative adapter bracket, in accordance with an embodiment of the disclosure.

FIG. 4A illustrates an exploded view of the SSD module 300 mounted within an alternative adapter bracket 400, in accordance with an embodiment of the disclosure. The adapter bracket 400 and its components can be made of sheet metal using conventional metal fabrication techniques such as bending, forming, and stamping. In alternative embodiments, the adapter bracket 400 can be made from stainless steel, mild steel, or any material that is cost effective; and achieves high levels of hardness and corrosion resistance. Once the SSD module 300 is mounted within the adapter bracket 400, the adapter bracket 400 can be inserted into a carrier and chassis assembly.

The adapter bracket 400 can include a left wall element 420 and a right wall element 430. The adapter bracket 400 can also include a receiving space 410. The left wall element 420 and the right wall element 430 are located on opposing sides of the receiving space 410. The left and right wall elements 420 and 430 can include receiving elements 411 configured to secure the SSD module 300. The left wall element 420 can also include sliding structures 425 configured to receive the SSD module 300 into the adapter bracket 400. Similarly, the right wall element 430 can also include sliding structures 435 similar to the sliding structures 425. The SSD module 300 can be inserted into the adapter bracket 400 in a shear direction 60 along the sliding structures 425 and 435.

Figure 4B:
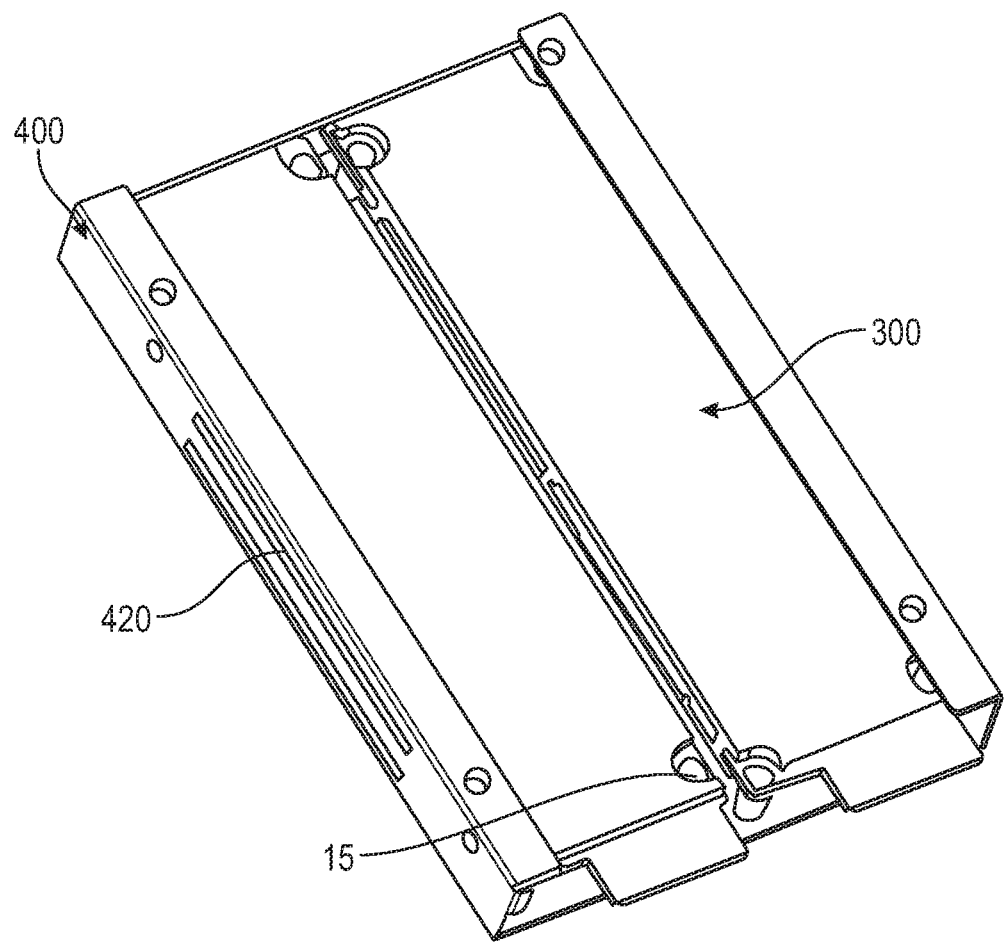
FIG. 4B illustrates the assembly of the SSD module within the adapter bracket of FIG. 4A, in accordance with an embodiment of the disclosure.

Once the SSD Module 300 is slid into the receiving space 410 of the adapter bracket 400, the SSD module 300 is secured using securing element (not shown). As illustrated above, the SSD Module 300 can include apertures that coincide with the receiving elements 411 of the adapter bracket 400. FIG. 4B illustrates the assembly of the SSD module 300 within the adapter bracket 400. In some embodiments, securing elements 15 can be received through the apertures and inserted into the receiving elements of the adapter bracket 400. The adapter bracket 400 can be inserted into a carrier and chassis assembly (not shown herein). This is discussed in greater detail below with respect to FIGS. 6A and 6B.

Figure 5A:
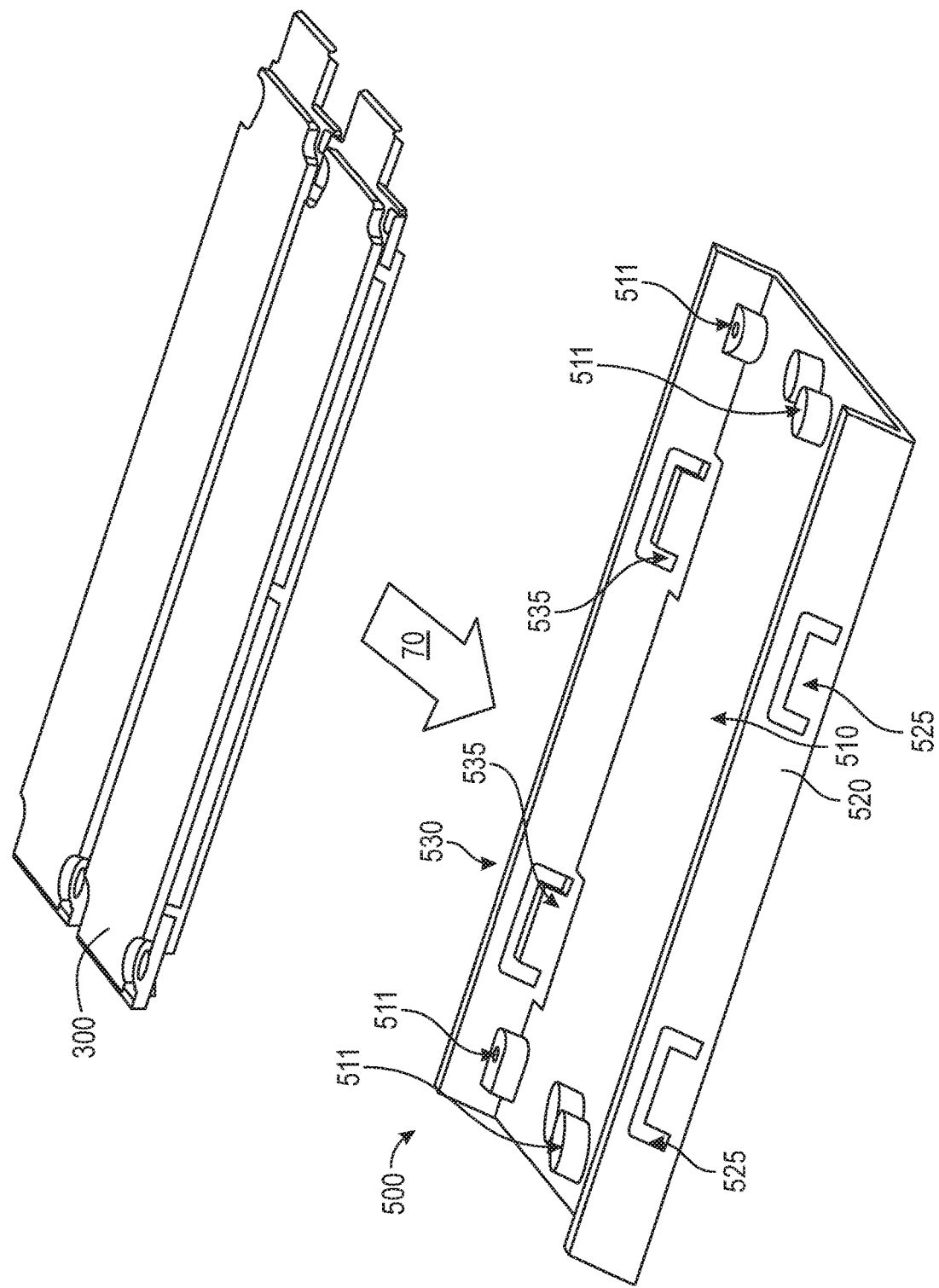
FIG. 5A illustrates an exploded view of the SSD module mounted within another alternative adapter bracket, in accordance with an embodiment of the disclosure.

FIG. 5A illustrates an exploded view of the SSD module 300 mounted within an alternative adapter bracket 500, in accordance with an embodiment of the disclosure. The adapter bracket 500 and its components can be made of sheet metal using conventional metal fabrication techniques such as bending, forming, and stamping. In alternative embodiments, the adapter bracket 500 can be made from stainless steel, mild steel, or any material that is cost effective; and achieves high levels of hardness and corrosion resistance. Once the SSD module 300 is mounted within the adapter bracket 500, the adapter bracket 500 can be inserted into a carrier and chassis assembly. This is discussed in greater detail below with respect to FIGS. 6A and 6B.

The adapter bracket 500 can include a left wall element 520 and a right wall element 530. The adapter bracket 500 can also include a receiving space 510. The left wall element 520 and the right wall element 530 are located on opposing sides of the receiving space 510. The receiving space 510 can include receiving elements 511 configured to secure the SSD module 300. The receiving elements 511 can be made up of a different material than the alternative adapter bracket 500. For example, the receiving elements can be made of a single flexible yet durable element, such as plastic. The left wall element 520 can include hook elements 525 configured to secure the adapter bracket 400. Similarly, the right wall element 530 can include hook elements 535 configured to secure the adapter bracket 500.

Figure 5B:
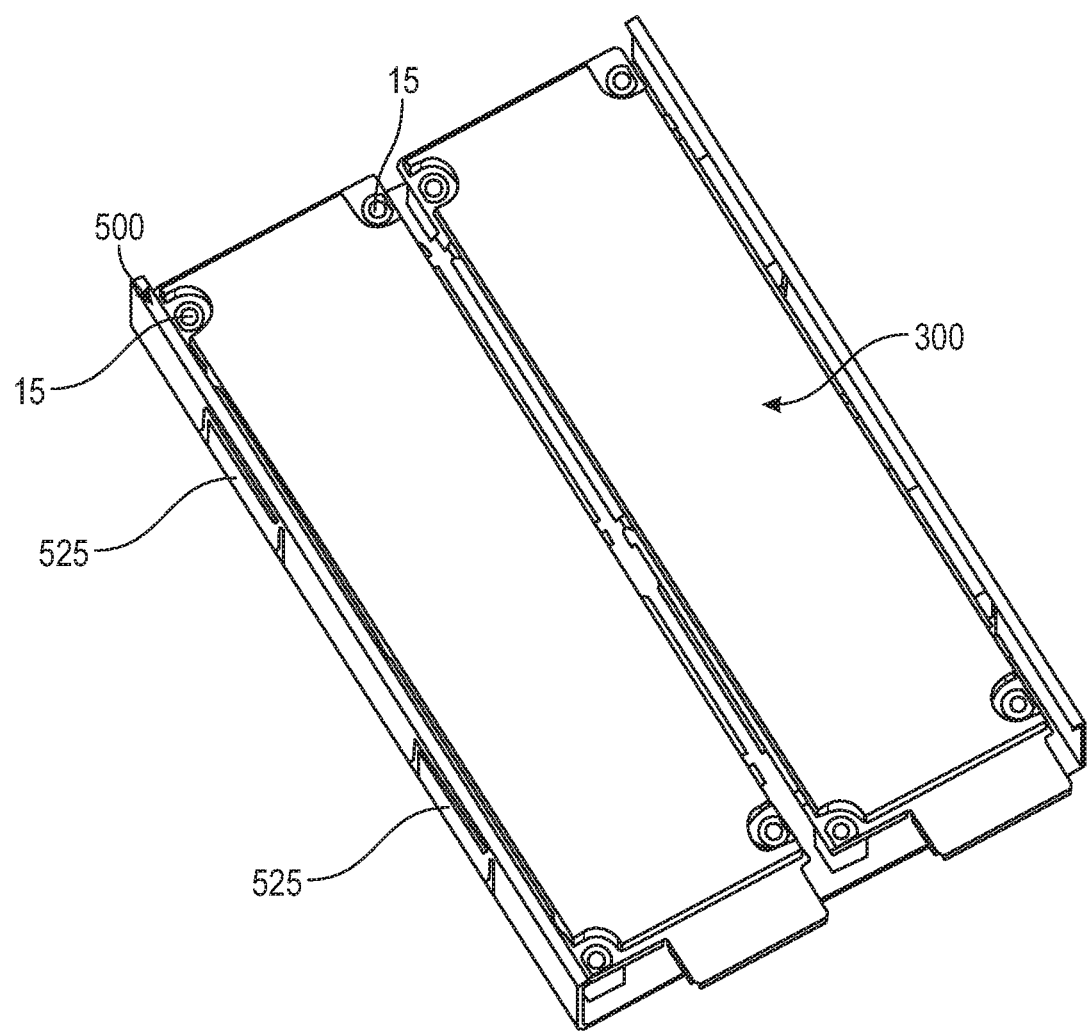
FIG. 5B illustrates the assembly of the SSD module within the adapter bracket of FIG. 5A, in accordance with an embodiment of the disclosure.

The SSD module 300 can be inserted into the adapter bracket 500 in normal direction 70. Once inserted into the receiving space 510 of the adapter bracket 500, the SSD module 300 comes in contact with the hook elements 525 and 535. The hook elements 525 and 535 secures the SSD module 300 within the adapter bracket 500. FIG. 5B illustrates the assembly of the SSD module 300 within the adapter bracket 500. In some embodiments, securing elements 15 can be received through the apertures and inserted into the receiving elements of the adapter bracket 500 to secure the SSD module 300. The adapter bracket 500 can be inserted into a carrier and chassis assembly (not shown herein). This is discussed in greater detail below with respect to FIGS. 6A and 6B.

Figure 6A:
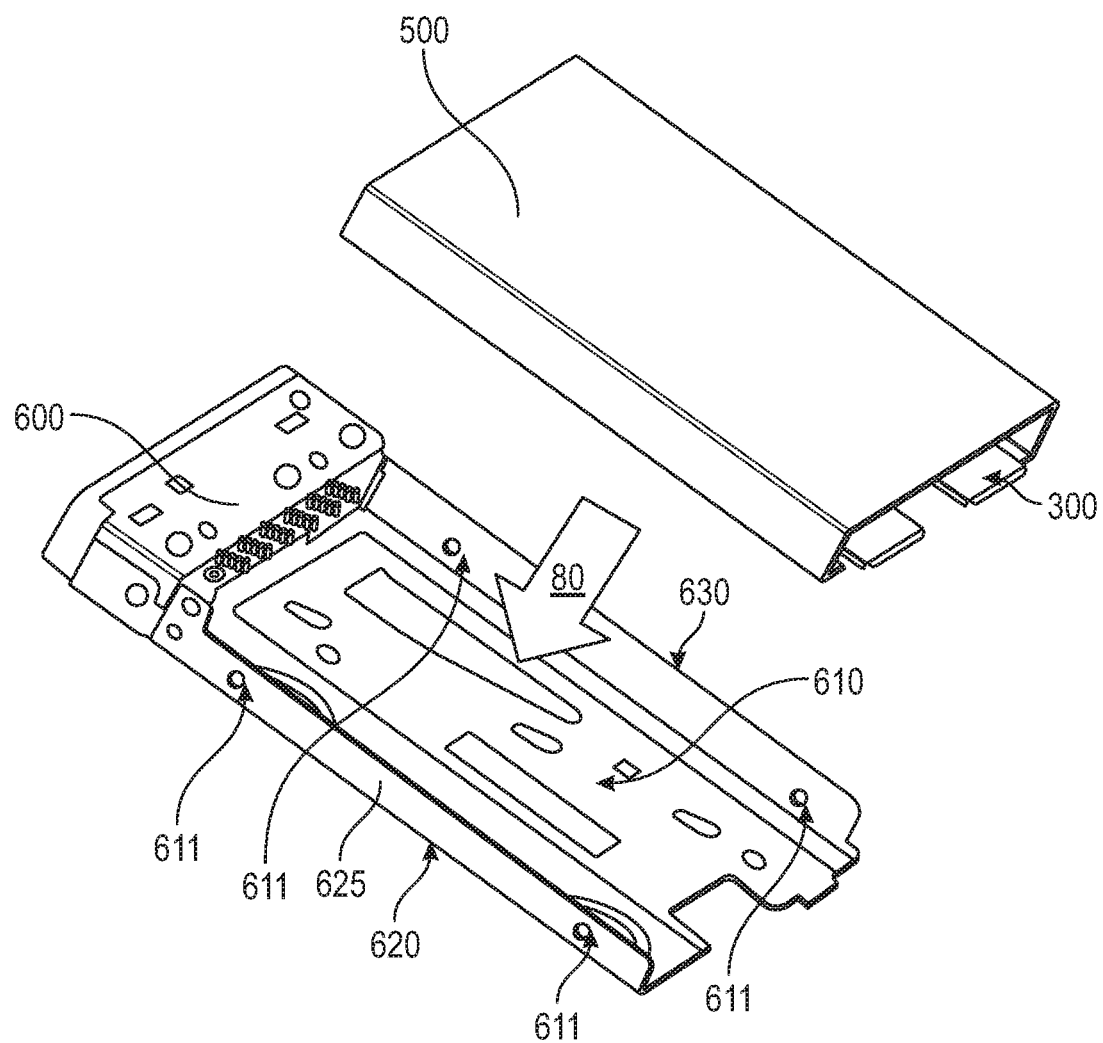
FIG. 6A illustrates an exploded view of the adapter bracket housing the SSD module mounted within a carrier device, in accordance with an embodiment of the disclosure.

FIG. 6A illustrates an exploded view of the adapter bracket 500 housing the SSD module 300, and the carrier device 600 housing the adapter bracket 500, in accordance with an embodiment of the disclosure. While FIGS. 6A and 6B specifically discuss the adapter bracket 500, it should be understood that the adapter brackets 200 and 400, discussed above, can be implemented herein. The carrier device 600 can include a left wall structure 620 and a right wall structure 630. The carrier device 600 can also include a receiving area 610. The left wall structure 620 and the right wall structure 630 are located on opposing sides of the receiving area 610. The receiving area 610 can include receiving components 611 configured to secure the adapter bracket 500. The left wall structure 620 can include latching elements 625 configured to secure the adapter bracket 500. Similarly, the right wall structure 630 can include latching elements (not shown) configured to secure the adapter bracket 500.

Figure 6B:
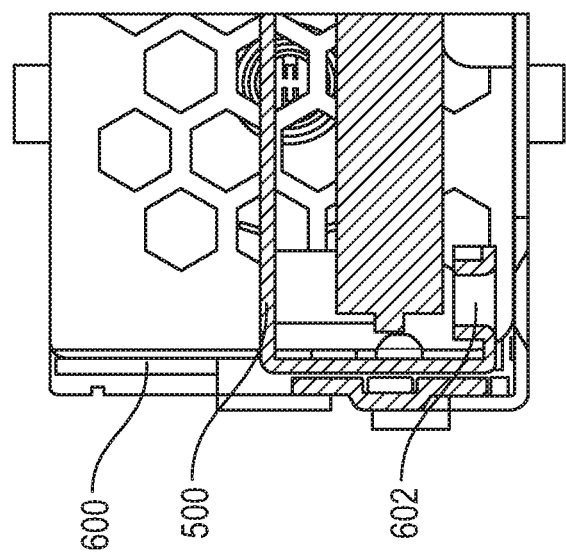
FIG. 6B illustrates the assembly of the adapter bracket housing the SSD module mounted within the carrier device, in accordance with an embodiment of the disclosure.
Figure 6B:
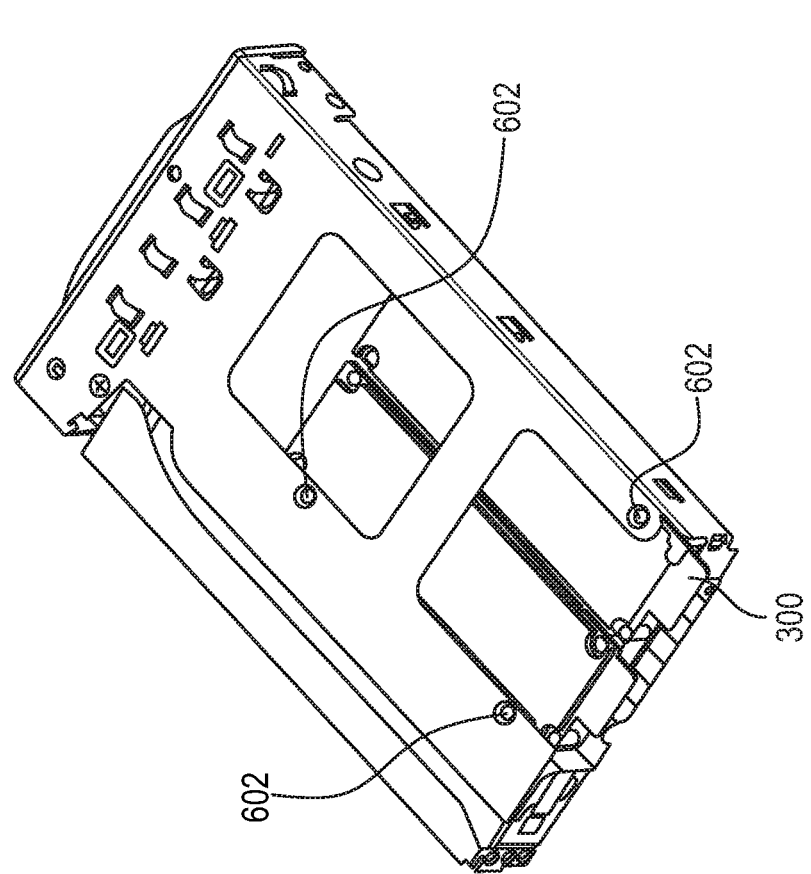

The adapter bracket 500 can be inserted into the carrier device 600 in normal direction 80. Once inserted into the receiving area 610 of the carrier device 600, the adapter bracket 500 comes in contact with the latching elements 625. The latching elements 625 secures the adapter bracket 500 within the carrier device 600. FIG. 6B illustrates the assembly of the adapter bracket 500 housing the SSD module 300, and the carrier device 600 housing the adapter bracket 500. Once secured within the carrier device 600, the adapter bracket 500 is mounted using securing elements (not shown) into apertures 602 of the carrier device 600. It should be understood that FIG. 6B illustrates a 2.5-inch adapter bracket 500 mounted into a 3.5-inch carrier device 600.

Figure 6C:
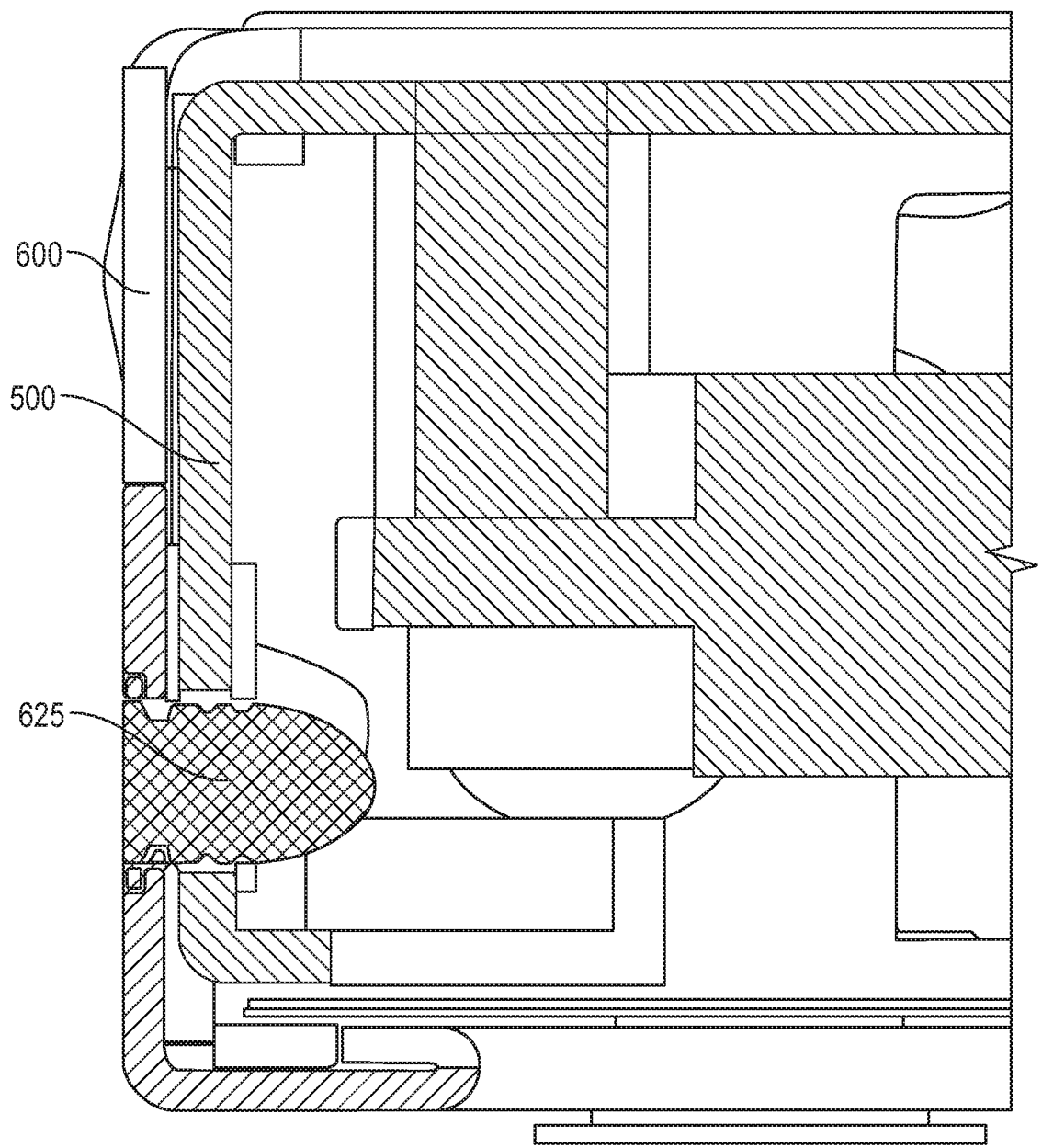
FIG. 6C illustrates a cut-away of the assembly of the adapter bracket housing the SSD module, and the carrier device housing the adapter bracket, in accordance with an embodiment of the disclosure.

FIG. 6C illustrates the assembly of the adapter bracket 500 housing the SSD module (not shown), and the carrier device 600 housing the adapter bracket 500. The latching element 625 secures the adapter bracket 500 to the carrier device 600. It should be understood that FIG. 6C illustrates a 2.5-inch adapter bracket 500 mounted into a 2.5-inch carrier device 600.

While particular embodiments of the present invention have been shown and described, it will be obvious to those skilled in the relevant arts that changes and modifications may be made without departing from the invention in its broader aspects. Therefore, the aim in the appended claims is to cover all such changes and modifications that fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

The terminology used herein is for the purpose of describing particular embodiments only and is not intended to limit the invention. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. An adapter bracket configured to be mounted within a carrier device, the adapter bracket comprising:
   a receiving space configured to receive a storage module;
   a first wall element located at a first side of the receiving space, and a second wall element located opposite of the first wall element;
   a plurality of receiving elements located between the first wall element and the second wall element, wherein the receiving elements are configured to receive a first securing element inserted from a first side of the storage module; and
   a first hook element extending from the first wall element and a second hook element extending from the second wall element, each hook element comprising an inwardly bent portion to support a second side of the storage module opposing the first side, the first and second hook elements being configured to aid in securing the storage module in the receiving space,
   wherein when the adapter bracket is mounted within the carrier device, one or more second securing elements are inserted into apertures of the carrier device and corresponding apertures of the first and second wall elements located on the first sides of the storage module.

2. The adapter bracket of claim 1, wherein the plurality of receiving elements are located in different positions so as to correspond to different storage modules having different sizes.

3. The adapter bracket of claim 1, wherein the receiving elements comprises a threaded hole configured to receive a screw.

4. The adapter bracket of claim 1, wherein the first wall element comprises a first sliding structure, and the second wall element comprises a second sliding structure.

5. The adapter bracket of claim 4, wherein the storage module is inserted into the adapter bracket in a shear direction along the first sliding structure and the second sliding structure.

6. The adapter bracket of claim 1, wherein the storage module comprises more than one SSD card.

7. The adapter bracket of claim 1, wherein the receiving elements located between the first wall element and the second wall element comprise a different material than that of the adapter bracket.

8. The adapter bracket of claim 1, wherein the first hook element extends inwardly from the first wall element toward the second wall element.

9. The adapter bracket of claim 8, wherein the second hook element extends inwardly from the second wall element toward the first wall element.

10. The adapter bracket of claim 9, wherein the storage module is configured to be inserted into the adapter bracket in a normal direction.

11. A carrier device configured to secure the adapter bracket of claim 1, the carrier device comprising:
    a receiving area configured to receive the adapter bracket;
    a first wall structure located at a first side of the receiving area, and a second wall structure located opposite of the first wall structure; and
    a plurality of receiving components located between the first wall structure and the second wall structure, wherein the receiving components are configured to receive a securing element through an aperture defined in the adapter bracket.

12. The carrier device of claim 11, wherein the receiving components comprises a threaded hole configured to receive a screw.

13. A carrier device configured to house a storage module and be inserted into a server device, the carrier device comprising:
    an adapter bracket comprising:
       a receiving space configured to receive the storage module;
       a first wall element located at a first side of the receiving space, and a second wall element located opposite of the first wall element;
       a plurality of receiving elements located between the first wall element and the second wall element, wherein the receiving elements are configured to receive a first securing element inserted from a first side of the storage module; and
       a first hook element extending from the first wall element and a second hook element extending from the second wall element, each hook element comprising an inwardly bent portion to support a second side of the storage module opposing to the first side, the first and second hook elements being configured to aid in securing the storage module in the receiving space,
    when the adapter bracket is mounted within the carrier device, one or more second securing elements are inserted into apertures of the carrier device and corresponding apertures of the first and second wall elements located on the first side of the storage module.

14. The carrier device of claim 13, wherein the plurality of receiving elements are located in different positions so as to correspond to different storage modules having different sizes.

15. The carrier device of claim 13, wherein the receiving elements comprises a threaded hole configured to receive a screw.

16. The carrier device of claim 13, wherein the first wall element comprises a first sliding structure, and the second wall element comprises a second sliding structure.

17. The carrier device of claim 16, wherein the storage module is inserted into the adapter bracket in a shear direction along the first sliding structure and the second sliding structure.

18. The carrier device of claim 13, wherein the storage module comprises more than one SSD card.

19. The carrier device of claim 13, wherein the receiving elements located between the first wall element and the second wall element comprise a different material than that of the adapter bracket.

20. The carrier device of claim 13, wherein the first hook element extends inwardly from the first wall element toward the second wall element, and wherein the second hook element extends inwardly from the second wall element toward the first wall element.

* * * * *